(12) United States Patent
Gopalan (10) Patent No.: US 8,816,314 B2
(45) Date of Patent: Aug. 26, 2014

(54) CONTACT STRUCTURE AND METHOD FOR VARIABLE IMPEDANCE MEMORY ELEMENT

(75) Inventor: Chakravarthy Gopalan, Santa Clara, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/470,286

(22) Filed: May 12, 2012

(65) Prior Publication Data

US 2012/0313071 A1    Dec. 13, 2012

Related U.S. Application Data (60) Provisional application No. 61/486,204, filed on May 13, 2011.

(51) Int. Cl.
*H01L 29/02* (2006.01)
(52) U.S. Cl.
USPC ............... 257/2; 257/3; 257/4; 257/E45.002; 438/102; 438/253; 438/382; 438/478
(58) Field of Classification Search
CPC ............. H01L 45/1266; H01L 45/085; H01L 45/1273; H01L 45/141
USPC ........... 257/2–5, E45.002, E47.005; 438/102, 438/253, 382, 478
See application file for complete search history.

(56) References Cited

U.S. PATENT DOCUMENTS

| | | | |
|---|---|---|---|
| 5,761,115 A | 6/1998 | Kozicki | |
| 6,635,914 B2 | 10/2003 | Kozicki et al. | |
| 6,927,411 B2 | 8/2005 | Kozicki | |
| 7,294,875 B2 | 11/2007 | Kozicki | |
| 7,307,868 B2 | 12/2007 | Symanczyk | |
| 7,372,065 B2 | 5/2008 | Kozicki et al. | |
| 7,745,341 B2 | 6/2010 | Kim et al. | |
| 7,964,437 B2 | 6/2011 | Lung | |
| 8,084,760 B2 | 12/2011 | Lung et al. | |
| 8,115,586 B2 | 2/2012 | Hosoi et al. | |
| 2004/0164290 A1 | 8/2004 | Yi et al. | |
| 2007/0012987 A1 | 1/2007 | McTeer et al. | |

(Continued)

FOREIGN PATENT DOCUMENTS

KR    20060007902 A    1/2006

OTHER PUBLICATIONS

PCT International Search Report for PCT/US2012/044050.

(Continued)

*Primary Examiner* — Mark A Laurenzi (57) ABSTRACT

A memory element can include an opening formed within at least one insulating layer formed on an etch stop layer that exposes a first electrode portion and the etch stop layer at a bottom of the opening; a second electrode portion, formed on at least a side surface of the opening and in contact with the first electrode portion, the second electrode portion not filling the opening and being substantially not formed over a top surface of the at least one insulating layer; and at least one memory layer formed on a top surface of the at least one insulating layer and in contact with the second electrode portion, the at least one memory layer being reversibly programmable between at least two impedance states. Methods of forming such memory elements are also disclosed.

24 Claims, 7 Drawing Sheets

(56) References Cited

U.S. PATENT DOCUMENTS

| | | |
|---|---|---|
| 2008/0067486 A1 | 3/2008 | Karpov et al. |
| 2008/0179585 A1 | 7/2008 | Hsu |
| 2008/0266940 A1* | 10/2008 | Lai et al. ........................ 365/163 |
| 2010/0019215 A1 | 1/2010 | Lung et al. |
| 2010/0155687 A1* | 6/2010 | Reyes et al. ........................ 257/4 |
| 2010/0173479 A1* | 7/2010 | Joo ................................ 438/478 |
| 2010/0188879 A1 | 7/2010 | Sasaki |
| 2010/0190321 A1 | 7/2010 | Oh et al. |
| 2010/0252798 A1* | 10/2010 | Sumino ............................ 257/4 |
| 2011/0242874 A1 | 10/2011 | Chien et al. |
| 2012/0049146 A1 | 3/2012 | Liu |

OTHER PUBLICATIONS

PCT Written Opinion of the International Search Authority for PCT/US2012/044050.

* cited by examiner

CONTACT STRUCTURE AND METHOD FOR VARIABLE IMPEDANCE MEMORY ELEMENT

This application claims the benefit of U.S. Provisional Patent Application Ser. No. 61/486,204 filed on May 13, 2011, the contents of which are incorporated by reference herein.

TECHNICAL FIELD

The present disclosure relates generally to devices having variable impedance memory elements, and more particularly to contact structures for such memory elements.

BACKGROUND

Conventional conductive bridging random access memory (CBRAM) type elements (sometimes referred to as programmable metallization cells (PMCs)) and other resistive RAM (RRAM) type storage elements can include a memory layer programmable between two or more resistance states. Such conventional memory elements can include an "active" electrode formed with a metal, such as silver, that oxidizes and can ion conduct through a solid electrolyte.

A blanket layer of such a metal, such as silver, can be difficult to process (i.e., pattern with photolithography steps) due to resulting defects. Such processing can be particularly difficult when executed during a back end of line (BEOL) portion of a fabrication process. A BEOL portion of a process can occur after active devices have been formed in a substrate, and then covered with one or more interlayer dielectrics.

In addition, conventionally, a large interface area between an active electrode and a solid electrolyte can suffer from thermal instability and/or may contribute to variations in performance between memory elements.

BRIEF DESCRIPTION OF THE DRAWINGS

FIGS. 5A to 5E are a series of views showing a method of making a memory element like that of FIG. 1, according to an embodiment.

FIGS. 6A to 6H are a series of side cross sectional views showing a method of making a memory element like that of FIG. 2, according to an embodiment.

FIGS. 7A to 7D-1 are a series of views showing a method of making a memory element like that of FIG. 3, according to an embodiment.

FIGS. 8A to 8F are a series of side cross sectional views showing a method of making a memory element like that of FIG. 4, according to an embodiment.

DETAILED DESCRIPTION

Embodiments disclosed herein show methods, and corresponding structures, for memory elements that can reduce an electrode contact area with a memory layer. Such memory elements may provide such a lower area contact without a pattern and etch step on a blanket deposited electrode layer, thus preventing defects that can occur in conventional approaches. Further, such reduced area contacts may provide for more uniform memory element response, as compared to conventional approaches.

Figure 1:
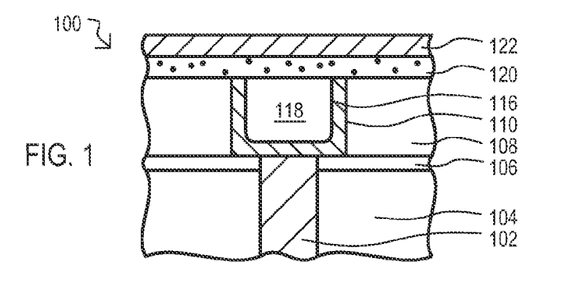
FIG. 1 is a side cross sectional view of a memory element having an etch stop layer according to an embodiment.

Referring to FIG. 1, a memory element according to one embodiment is shown in a side cross sectional view and designated by the general reference character 100. A memory element 100 can include a first electrode portion 102, a second electrode portion 116 formed on an etch stop layer (ESL) 106, a memory layer 120, and a top electrode 122. First and second electrode portions (102 and 116) can form a bottom electrode having a small contact area with memory layer 120.

First electrode portion 102 can be formed in a lower insulator 104. An etch stop layer (ESL) 106 can be formed on lower insulator 104. In the particular embodiment shown, a first electrode portion 102 can extend through an opening in ESL 106. However, in an alternate embodiment, an ESL can be formed over a portion of top surface of first electrode portion, and have an opening that exposes a top surface of the first electrode portion.

A lower insulator 104 may include one or more suitable insulating layers. A first electrode portion 102 can be formed of one or more conductive materials. In one particular embodiment a first electrode portion 102 can include copper.

A second electrode portion 116 can be formed in an opening 110 of an upper insulator 108 and in contact with a top surface of first electrode portion 102 and ESL 106. Upper insulator 108 can be formed over lower insulator 104 and first electrode portion 102. Upper insulator 104 may include one insulating layer, or multiple insulating layers forming a dielectric stack. In very particular embodiments, upper insulator 108 can be formed by silicon nitride and/or silicon oxynitride.

An ESL 106 can be any suitable material for stopping an etch process that forms an opening in upper insulator 108. That is, an etching process that forms opening 110 can be highly selective to upper insulator 108 over ESL 106.

A second electrode portion 116 can include one or more conductive films, and can be formed of any suitable conductive material that provides a desired resistance for a given element size. In some embodiments, in which a second electrode portion 116 forms all or part of an anode electrode of a CBRAM type element, a second electrode portion 116 can include one or more elements oxidizable to ion conduct within memory layer 120. In very particular embodiments, a second electrode layer 116 can include any of: silver or copper.

It is noted that ESL 106 can help ensure that an opening 110 maintains a desired low topography profile. Absent such a layer, a bottom of opening 110 can extend into a lower insulator 104 and/or first electrode portion 102, creating undesirable steps in a bottom surface. Absent ESL 106, a conformal layer of the second electrode portion 116 could have discontinuities due to undesirable topographic features within opening 110.

In other embodiments, in which a second electrode portion 116 forms all or part of a cathode electrode of a CBRAM, a second electrode portion 116 can be formed of one or more "inert" conductive materials (e.g., materials that are substantially not electrochemically active with respect to the memory layer 120). In very particular embodiments, conductive contact layer 112 can include any of tantalum or tantalum nitride.

Referring still to FIG. 1, an insulating region 118 can be formed within opening 110 between second electrode portion 116 formed on the sides of the opening 110. An insulating region 118 can include any suitable insulator (including a void). In particular embodiments, an insulating region 118 can include any of silicon nitride or silicon oxide, including silicon oxide formed by the decomposition of tetraethyl orthosilicate (TEOS).

A memory layer 120 can be programmed between two or more different impedance states. In some embodiments, a memory layer 120 can provide varying resistance values. In other embodiments, a memory layer 120 can provide varying capacitance values. In still other embodiments, a memory layer 120 can provide varying timed changes in impedance in response to the same sense conditions. A memory layer 120 can be a single layer, or can include multiple layers.

In very particular embodiments, a memory layer 120 can include an ion conductor, such as a solid electrolyte. Conductive filaments can be formed in memory layer 120 and also dissolved by application of electric fields. In very particular embodiments, a memory layer 120 can include any of a chalcogenide or a solid electrolyte.

A top electrode 122 can include any suitable conductive material. In some embodiments, in which a top electrode 122 forms all or part of an anode electrode of a CBRAM type element, a top electrode 122 can include one or more elements oxidizable to ion conduct within a memory layer 120. In other embodiments, in which a top electrode 122 forms all or part of a cathode electrode of a CBRAM element, a conductive contact layer 112 can be formed of "inert" conductive materials.

Figure 2:
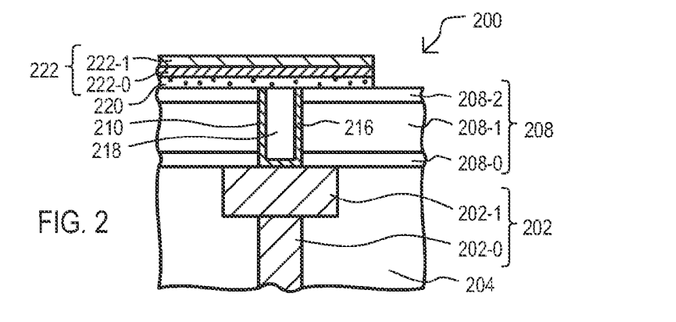
FIG. 2 is a side cross sectional view of a memory element having a hard etch mask according to an embodiment.

FIG. 2 shows a memory element 200 according to another embodiment. A memory element 200 can include sections like those of FIG. 1, and such like items are referred to by the same reference character, but with the first digit being a "2" instead of a "1".

FIG. 2 can differ from that of FIG. 1 in that a first electrode portion 202 can include a first member 202-0 and a second member 202-1 formed in a lower insulator 204. In a particular embodiments, a first member 202-0 can be part of a first interconnect layer formed by patterning one or more conductive layers. Similarly, a second member 202-1 can be part of a second interconnect layer formed over the first interconnect layer by patterning one or more conductive layers. While first and second members (202-0 and 202-1) can be formed from any suitable conductive material(s), in one particular embodiment, a first member 202-0 and/or a second portion 202-1 can include copper.

In other embodiments, a first electrode portion 202 can be formed with a "dual-damascene" like process. Such a process can create an opening in lower insulator corresponding to first member 202-0, and then create an opening in lower insulator corresponding to second member 202-1. One or more conductive materials can then fill both openings. In such a case, first and second members (202-0/1) can be integral portions of a same electrode structure.

FIG. 2 can also differ from FIG. 1 in that an upper insulator 208 can include a bottom layer 208-0, an interlayer insulator 208-1, and a top layer 208-2. In one embodiment, a bottom layer 208-0 can be an ESL for an etching step. In one particular embodiment, when opening 210 is formed, a bottom layer 208-0 can act as an etch stop when etching through interlayer insulator 208-1. That is, an initial etching operation can etch through interlayer insulator 208-1 and stop at bottom layer 208-0. The portion of the bottom layer 208-0 exposed at the bottom of the etched opening can then be removed to expose bottom contact 202, and complete opening 210.

In one embodiment, a top layer 208-2 can be a "hard" etch mask. That is, a top layer 208-2 can be formed with an opening and used as an etch mask instead of a resist based mask, or the like. An etch step that forms opening 210 (which contains electrode portion 216) can be highly selective to interlayer insulator 208-1 as compared to the hard etch mask 208-2.

FIG. 2 further differs from FIG. 1 in that a top electrode 222 can include a first conductive layer 222-0 and a second conductive layer 222-1.

It is noted that while FIG. 2 shows an embodiment with both and ESL and a hard etch mask, alternate embodiments may include a hard etch mask and not include an ESL.

Figure 3:
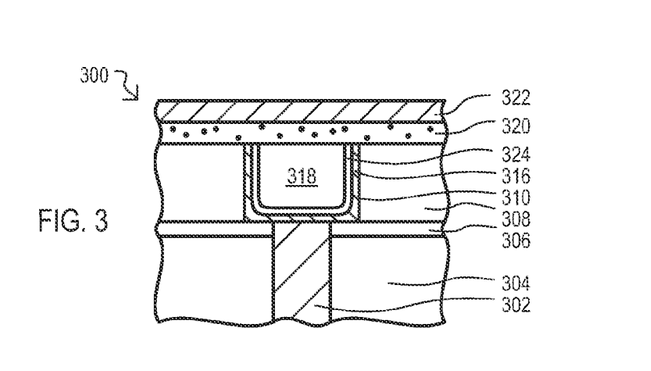
FIG. 3 is a side cross sectional view of a memory element having an etch stop layer according to another embodiment.

FIG. 3 shows a memory element 300 according to a further embodiment. A memory element 300 can include sections like those of FIG. 1, and such like items are referred to by the same reference character, but with the first digit being a "3" instead of a "1".

FIG. 3 differs from FIG. 1 in that a second electrode portion 316 can include an oxidized layer 324. An oxidized layer 324 can increase a resistance of a second electrode portion 316. In addition, in embodiments in which a second electrode portion 316 is an anode, forming an oxidized layer 324 can further reduce a contact interface area between an anode and a memory layer (i.e., solid electrolyte).

Figure 4:
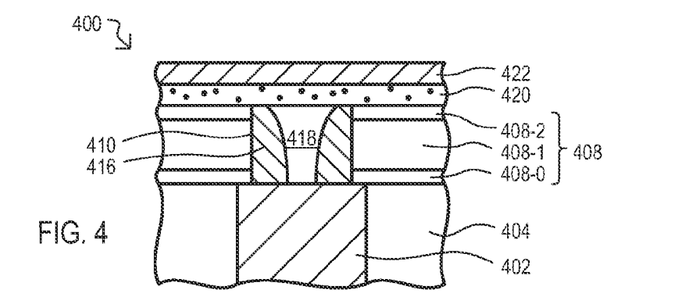
FIG. 4 is a side cross sectional view of a memory element having a hard etch mask according to another embodiment.

FIG. 4 shows a memory element 400 according to another embodiment. A memory element 400 can include sections like those of FIG. 2, and such like items are referred to by the same reference character, but with the first digit being a "4" instead of a "2".

FIG. 4 differs from FIG. 2 in that a second electrode portion 416 does not completely cover a bottom of opening 410. Further, in the embodiment shown, second electrode portion 416 can have a "sidewall" shape, having a thickness that is smaller at a top of opening 410 than at a bottom of opening 410.

Having described various memory element structures according to embodiments, methods of forming such structures will now be described.

FIGS. 5A to 5E show a method of forming a memory element 100 like that of FIG. 1, according to a particular embodiment.

Figure 5A:
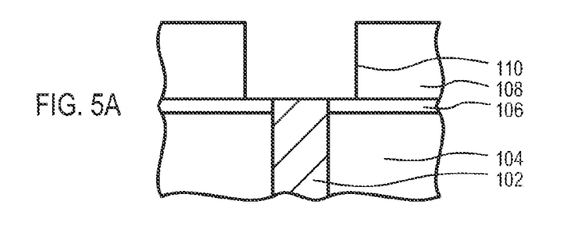

FIG. 5A shows a memory element 100 following the creation of opening 110 in upper insulator 108, which has exposed first electrode portion 102. In one embodiment, an etch mask (not shown) can be formed on a top surface of upper insulator 108 having an opening corresponding to opening 110. An etching step can then be performed that uses ESL 106. ESL 106 can protect lower insulator 104 from such etching. In such an embodiment, ESL 106 and first electrode portion 102 can from all or part of a bottom surface of opening 110.

Figure 5B:
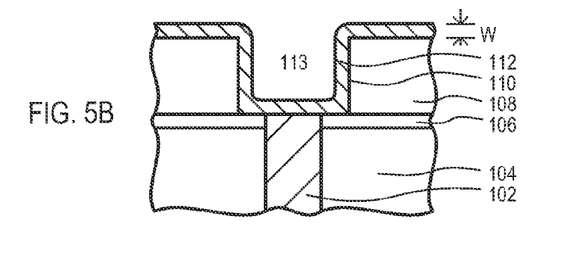

FIG. 5B shows the formation of a conductive contact layer 112 over a top surface of top insulator 104 and within opening 110. As shown, conductive contact layer 112 does not fill opening 110, thus a space 113 can exist between portions of contact layer 112 on opposing sides of the opening 110. A conductive contact layer 112 can have a width (shown as W).

As noted above in conjunction with FIG. 1, in some embodiments, a conductive contact layer 112 can form an active electrode, including one or more elements oxidizable in a subsequently formed memory layer.

Figure 5C:
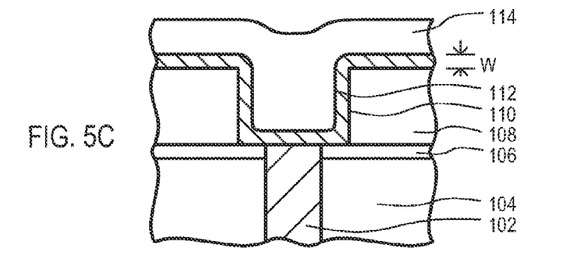

FIG. 5C shows the formation of a fill layer 114. A fill layer 114 can be formed within space 113 and over conductive contact layer 112. A fill layer 114 can include one or more insulating layers. As noted above, in some embodiments, a fill layer 114 may only partially fill opening 113 leaving a void. Alternatively, no fill layer 114 can be employed, leaving a void (i.e., space 113).

Figure 5D:
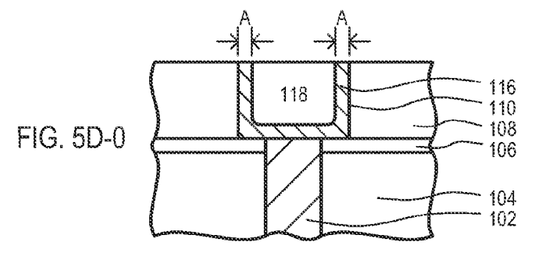

FIG. 5D-0 shows the removal of the conductive contact layer 112 from a top surface of upper insulator 108. As a result, a reduced area contact structure 116 can be formed. In such a contact structure 116, a top surface of conductive contact layer 112 is exposed. Such top surface portions can present a surface area (shown as A) that is proportional to a width of conductive contact layer 112. In the embodiment shown, the process actions of FIG. 5D-0 can form insulating region 118 within opening 110.

In particular embodiments, removing the conductive contact layer 112 can include a planarization step that planarizes to a top surface of upper insulator 108. A planarization step can include chemical-mechanical polishing (CMP), etching, or combinations thereof.

Figure 5D:
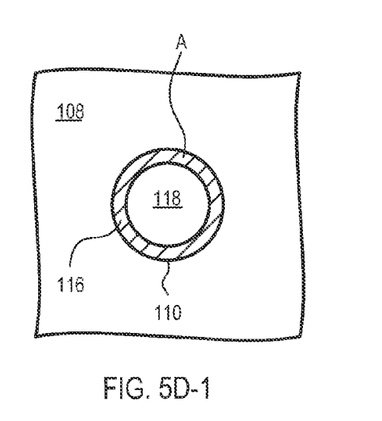

FIG. 5D-1 shows a top plan view of the structure of FIG. 5D-0. As shown, an area of reduced area contact structure 116 can be substantially smaller than that of an opening 110. While FIG. 5D-1 shows a reduced area contact structure 116 having an annular structure with a solid bottom, alternate embodiments can include different shapes according to a shape of an opening 110.

Figure 5E:
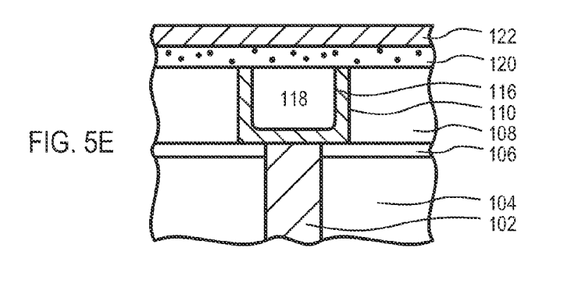

FIG. 5E shows the formation of a memory layer 120 and top electrode 122. As noted above, in particular embodiments, a memory layer 120 can include an ion conductor 120 which can enable static and/or dynamic changes in an electrical property (e.g., resistance and/or capacitance) in response to ion conduction in or through the material in response to an electric field. A memory layer 120 can include one or more layers, and in some embodiments can include a solid electrolyte. In very particular embodiments, a memory layer 120 can include chalcogenide and/or a metal oxide in which conductive portions can be formed via electrochemical reactions.

In one embodiment, a memory layer 120 and top electrode 122 can be formed by depositing one or more layers. The ion memory and top electrode layer(s) can then be patterned. In alternate embodiments, a memory layer 120 can be patterned separate from top electrode 122.

FIGS. 6A to 6H show a method of forming a memory element 200 like that of FIG. 2, according to a particular embodiment.

Figure 6A:
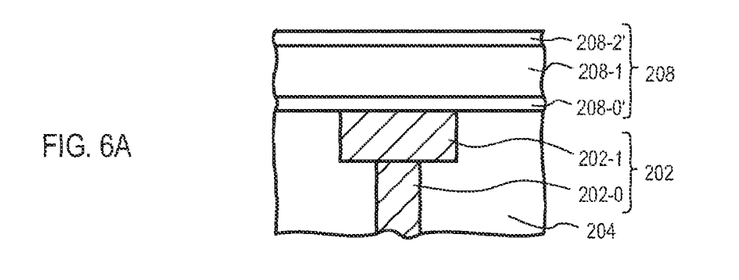

FIG. 6A shows the formation of an upper insulator 208 over second electrode member 202-1. Upper insulator 208 can include an ESL 208-0, an interlayer insulator 208-1 and a hard etch mask layer 208-2. As noted above, materials for layers 208-0/1/2 can be selected according to an etching step used to create an opening within interlayer insulator 208-1.

Figure 6B:
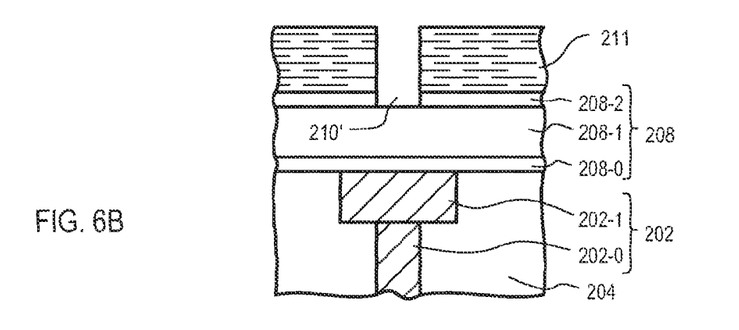

FIG. 6B shows the formation of mask opening 210' within hard etch mask layer to create a hard etch mask 208-2. In the embodiment shown, mask opening 210' can be created by forming an etch mask 211 on a top surface of etch stop layer, and then etching opening 210'. It is understood that etch mask 211 can then be removed.

Figure 6C:
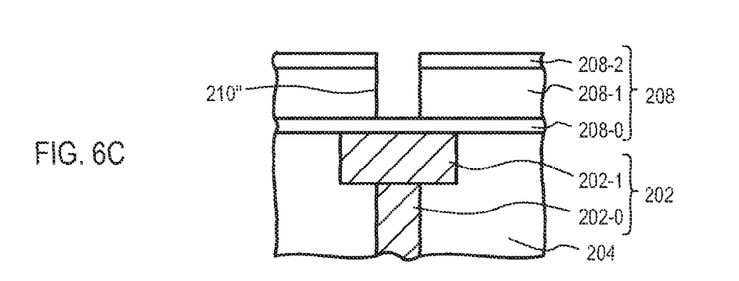

FIG. 6C shows the etching of opening 210" through interlayer insulator 208-1 using hard etch mask 208-2. ESL 208-0 serves as an endpoint for such an etching step. That is, an etch that creates opening 210 through interlayer insulator 208-1 can be highly selective to interlayer 208-1 as compared to ESL 208-0.

Figure 6D:
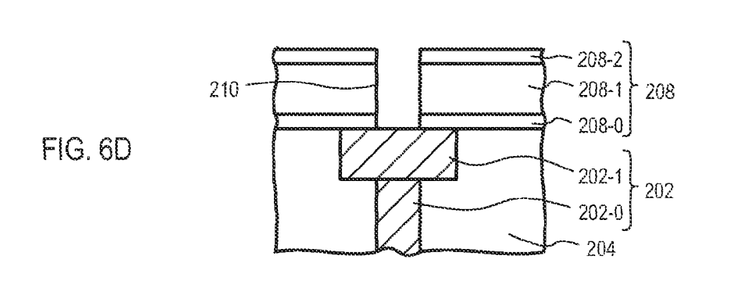

FIG. 6D shows the creation of an opening through ESL 208-0 to thereby form an opening 210 that exposes electrode member 202-1.

Figure 6E:
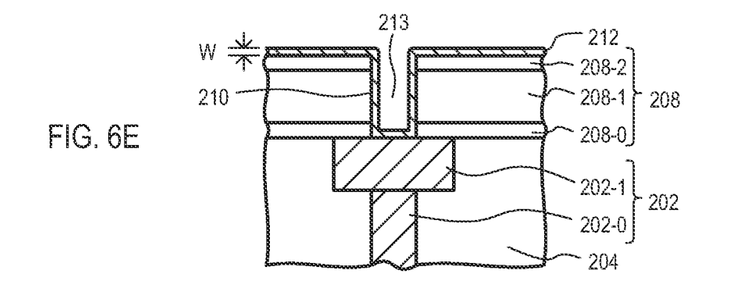

FIG. 6E shows the formation of a conductive contact layer 212 like that described in FIG. 5B. Conductive contact layer 212 can be formed on a top surface of hard etch mask 208-2, and on sides of opening 210, in contact with interlayer insulator 208-1, ESL 208-0 and second electrode member 202-1.

Figure 6F:
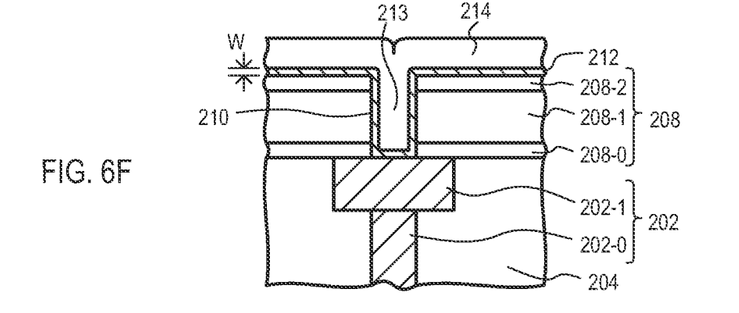

FIG. 6F shows the formation of a fill layer 214. A fill layer 214 can be formed within space 213 and over conductive contact layer 212. A fill layer 214 can include one or more insulating layers. As in the case of FIG. 5C, in alternate embodiments, formation of a fill layer 214 can create a void, or a fill layer 214 may not be used.

Figure 6G:
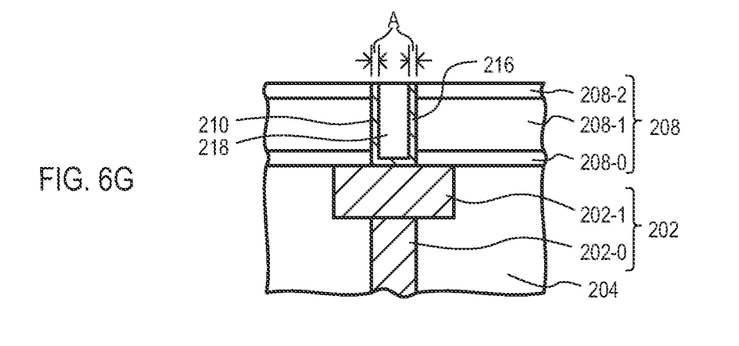

FIG. 6G shows the removal of the conductive contact layer 212 from a top surface of upper insulator 208 (i.e., top surface of hard etch mask 208-2). As a result, a reduced area contact structure 216 can be formed. As in the embodiment of FIGS. 5A to 5E, a surface area (shown as A) can be related to a width of conductive contact layer 213, and smaller than that presented by opening 210.

In particular embodiments, removing the conductive contact layer 212 can include a planarization step, like that described above in FIGS. 5A to 5E, or an equivalent, and can form an insulating region 218.

Figure 6H:
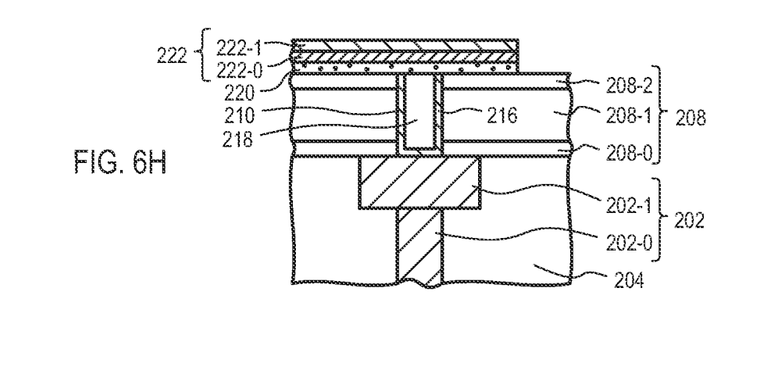

FIG. 6H shows the formation of an ion conductor 220 and top electrode 222. An ion conductor 220 can take the form of that described in FIG. 1 above, or an equivalent.

FIGS. 7A to 7D-1 show a method of forming a memory element 300 like that of FIG. 3, according to a particular embodiment. It is assumed that processing has occurred a shown in FIG. 5A, or an equivalent, to create an opening 310 in an upper insulator 308.

Figure 7A:
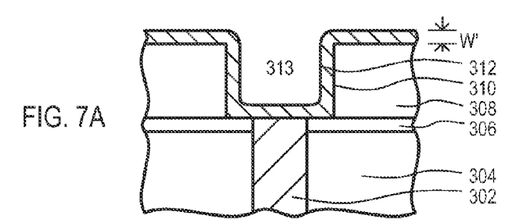

FIG. 7A shows the formation of a conductive contact layer 312 over a top surface of top insulator 304 and within opening 310. Such an action an include processing like that shown in FIG. 5B, or an equivalent. However, unlike FIG. 5B, it is assumed that conductive contact layer 312 is formed from a material that is oxidizable.

Figure 7B:
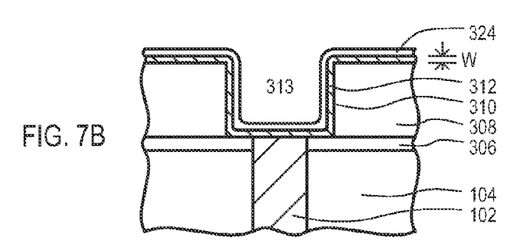

FIG. 7B shows the oxidation of a portion of conductive contact layer 312 to form oxidized portion 324. Such an oxidation step can further reduce a width (W) of a conductive contact layer 312.

Figure 7C:
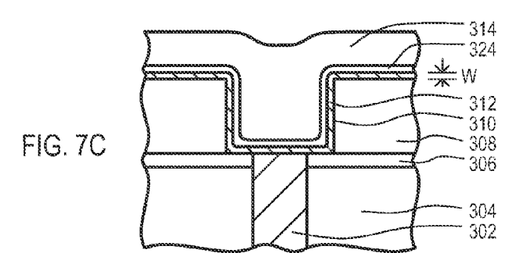
Figure 7D:
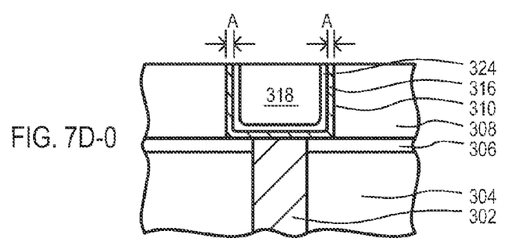
Figure 7D:
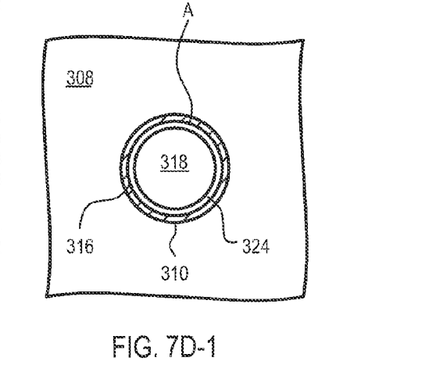

FIG. 7C shows the formation of a fill layer 314. Such an action can include processing like that described for FIG. 5C, or an equivalent.

FIGS. 7D-0 and 7D-1 can include actions like those noted for FIGS. 5D-0 and 5D-1. However, as shown in FIG. 7D-1 a contact area "A" can be proportional to a width of layer "W", less the thickness of the oxidized portion.

FIGS. 8A to 8F show a method of forming a memory element 400 like that of FIG. 4, according to a particular embodiment.

Figure 8A:
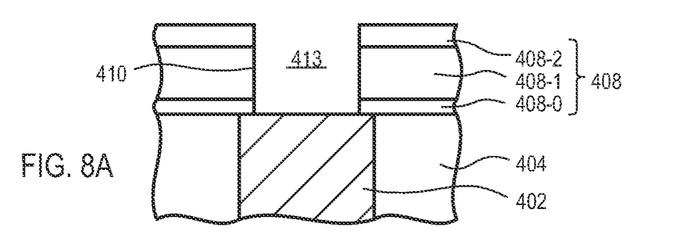

Referring to FIG. 8A, it is assumed that processing has occurred a shown in FIGS. 6A to 6D, or an equivalent, to create an opening 410 in an upper insulator 408. An upper insulator 408 can include a bottom layer 408-0, which serves as an ESL, a top layer 408-2, which serves as a hard etch mask 408-2, or both.

Figure 8B:
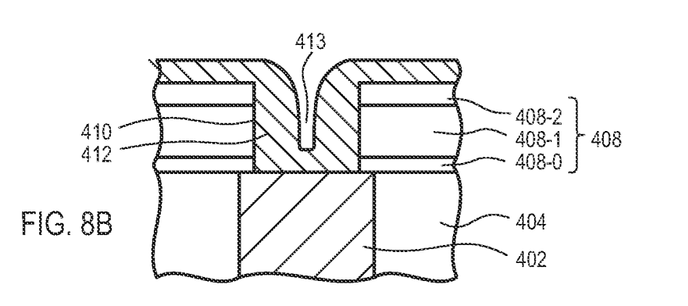

FIG. 8B shows the formation of a conductive contact layer 412 over a top surface of upper insulator 408 and within opening 410. Such an action an include processing like that shown in FIG. 5B, or an equivalent.

Figure 8C:
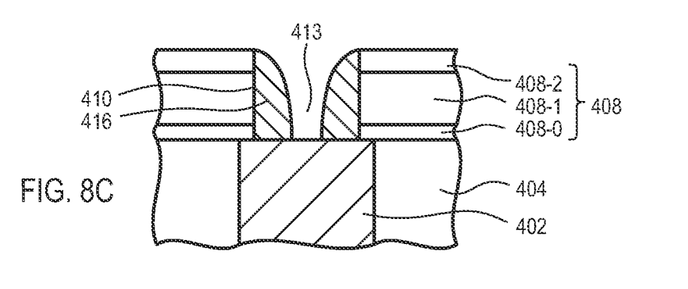

FIG. 8C shows an anisotropic etching of the conductive contact layer to form a "sidewall" type second electrode portion 416.

Figure 8D:
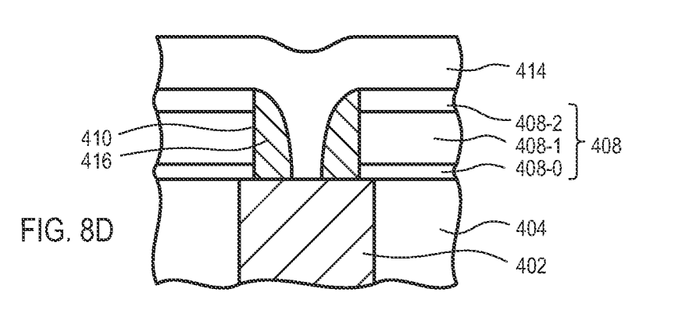

FIG. 8D shows the formation of a fill layer 414. A fill layer 414 can be formed within space 413, and can include processing as described for FIG. 5C, or an equivalent.

Figure 8E:
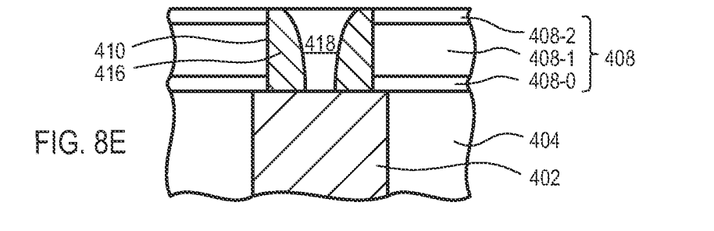

FIG. 8E shows a planarization step which can planarize to remove a portion of upper insulator 408 and expose top portions of second electrode portion 416. Such an action can include processing like that described for FIG. 5D-0, or an equivalent.

Figure 8F:
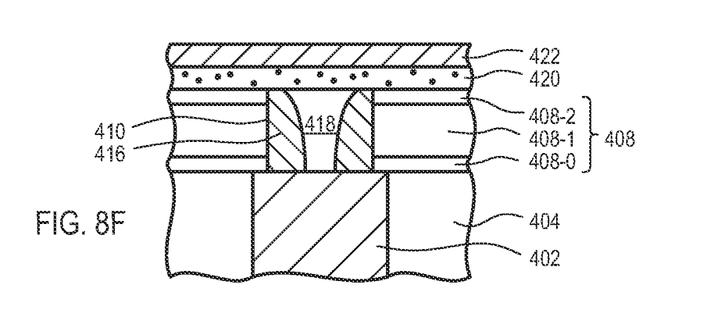

FIG. 8F shows the formation of a memory layer 420 in contact with second electrode portion 416, as well as a top electrode 422 formed over memory layer 420. Such an action can include processing like that described for FIG. 5E, or an equivalent.

Memory structures and method according to the embodiments may be included in, and used to form, storage elements in a standalone memory device (i.e., a memory device providing substantially only storage functions). In alternate embodiments, such a memory device may be embedded into larger integrated circuit device. In particular embodiments, such memory structures can be formed at a "back-end" of a manufacturing process, being formed after active devices (e.g., transistors) have been formed in a semiconductor substrate, or the like.

As understood from the embodiments above, active electrodes can be formed with a small contact area to a memory layer without masking and etching a blanket layer of an active material. Further, a contact area can be controlled according to a deposited electrode thickness (e.g., W in FIGS. 5D-0, 6E, and 7C), instead of a patterning step (such a photolithographic step).

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory element, comprising:
an opening formed within at least one insulating layer formed on an etch stop layer that exposes a first electrode portion and the etch stop layer at a bottom of the opening;
a second electrode portion, formed on at least a side surface of the opening and not formed over a top surface of the at least one insulating layer, the second electrode portion being in contact with the first electrode portion; and
at least one memory layer formed on a top surface of the at least one insulating layer and in contact with the second electrode portion, the at least one memory layer being reversibly programmable between at least two impedance states; wherein
the opening has no steps in its bottom surface for a low topography profile.

2. The memory element of claim 1, wherein:
the etch stop layer is selected from the group of: silicon nitride and silicon oxynitride; and
the one insulating layer is formed from a material different than the etch stop layer.

3. The memory element of claim 1 wherein:
the second electrode portion comprises an annular shaped portion.

4. The memory element of claim 1, wherein:
the second electrode portion comprises a conductive material selected from the group of: tantalum, tantalum nitride.

5. The memory element of claim 1, wherein:
the at least one memory layer comprises a solid electrolyte; and
the second electrode portion comprises at least one metal oxidizable in the solid electrolyte.

6. The memory element of claim 1, wherein:
the at least one memory layer is selected from the group of: a chalcogenide and a metal oxide.

7. The memory element of claim 1, further including:
a fill insulator formed within the opening between portions of the second electrode formed on opposing sides of the opening.

8. A memory element, comprising:
an opening formed within at least a hard etch mask and at least one insulating layer that is formed on an etch stop layer, the opening exposing a first electrode portion at a bottom of the opening;
a second electrode portion, formed on at least a side surface of the opening and not over a top surface of the hard etch mask, the second electrode portion being in contact with the first electrode portion; and
at least one memory layer formed on a top surface of the hard etch mask and in contact with the second electrode portion, the at least one memory layer being reversibly programmable between at least two impedance states; wherein
the opening has no steps in its bottom surface for a low topography profile.

9. The memory element of claim 8 wherein:
the second electrode portion comprises an annular shaped portion.

10. The memory element of claim 8, wherein:
the at least one memory layer comprises a solid electrolyte; and
the second electrode portions comprises at least one metal oxidizable in the solid electrolyte.

11. The memory element of claim 8, wherein:
the at least one memory layer is selected from the group of: a chalcogenide and a metal oxide.

12. The memory element of claim 8, further including:
a fill insulator formed within the opening between portions of the second electrode formed on opposing sides of the opening.

13. The memory element of claim 8, further including:
an etch stop layer formed below the at least one insulating layer and in contact with the first electrode portion.

14. The memory element of claim 1, wherein:
the at least one memory layer comprises a solid electrolyte; and
the second electrode portion is a cathode formed of materials that are not substantially oxidizable in the solid electrolyte.

15. The memory element of claim 1 wherein:
the second electrode portion comprises a sidewall shape, having a thickness that is smaller toward a top of the opening than at a bottom of the opening.

16. The memory element of claim 1, wherein:
the second electrode portion comprises a metal selected from the group of: copper and silver.

17. The memory element of claim 1, wherein:
the at least one insulating layer includes a hard etch mask layer formed over an interlayer insulator; wherein
the hard etch mask layer provides a high etch selectivity with respect to the interlayer insulator.

18. The memory element of claim 1, wherein:
the first electrode portion includes
a first member formed from a first interconnect layer, and
a second member in contact with the first member, formed from a second interconnect layer.

19. The memory element of claim 7, wherein:
the fill insulator is selected from the group of: silicon nitride and silicon oxide, including silicon oxide formed by the decomposition of tetraethyl orthosilicate (TEOS).

20. The memory element of claim 8, wherein:
the at least one memory layer comprises a solid electrolyte; and
the second electrode portion is a cathode formed of materials that are not substantially oxidizable in the solid electrolyte.

21. The memory element of claim 8 wherein:
the second electrode portion comprises a sidewall shape, having a thickness that is smaller toward a top of the opening than at a bottom of the opening.

22. The memory element of claim 8, wherein:
the second electrode portion comprises a metal selected from the group of: copper and silver.

23. The memory element of claim 1, wherein:
the etch stop layer and the first electrode portion form at least a portion of a bottom surface of the opening.

24. The memory element of claim 1, wherein:
the first electrode portion forms the bottom surface of the opening.

* * * * *